(12) United States Patent
Lee et al.

(10) Patent No.: US 7,568,805 B2
(45) Date of Patent: Aug. 4, 2009

(54) ILLUMINATION UNIT AND IMAGE PROJECTING APPARATUS EMPLOYING THE SAME

(75) Inventors: Kye-hoon Lee, Suwon-si (KR); Won-yong Lee, Suwon-si (KR); Young-chol Lee, Gunpo-si (KR); Kirill Sokolov, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 608 days.

(21) Appl. No.: 11/154,671

(22) Filed: Jun. 17, 2005

(65) Prior Publication Data

US 2006/0028816 A1    Feb. 9, 2006

(30) Foreign Application Priority Data

Aug. 3, 2004    (KR) .................. 10-2004-0061095

(51) Int. Cl.
| | |
|---|---|
| G03B 21/00 | (2006.01) |
| G03B 21/28 | (2006.01) |
| G03B 21/20 | (2006.01) |
| G03B 21/26 | (2006.01) |
| G02F 1/1335 | (2006.01) |
| G02B 27/14 | (2006.01) |
| G02B 15/14 | (2006.01) |
| G02B 5/04 | (2006.01) |

(52) U.S. Cl. ............................. 353/33; 353/81; 353/84; 353/94; 353/99; 349/5; 359/630; 359/684; 359/834

(58) Field of Classification Search .................. 353/20, 353/31, 33, 34, 37, 81, 84, 94, 99, 102; 359/618, 359/629, 634, 636, 640, 834, 833; 362/231, 362/241, 234; 361/245; 349/5–9
See application file for complete search history.

(56) References Cited

U.S. PATENT DOCUMENTS 5,619,284 A    4/1997    Magocs (Continued)

FOREIGN PATENT DOCUMENTS

CN    1388386 A    1/2003

(Continued)

OTHER PUBLICATIONS

European Search Report dated Dec. 16, 2005 issued in EP 05107052.2.

(Continued)

*Primary Examiner*—Melissa J Koval
(74) *Attorney, Agent, or Firm*—Stanzione & Kim LLP

(57) ABSTRACT

An illumination unit includes multiple light source units to emit light having different wavelengths, and a synthesizing prism to synthesize the emitted light. The synthesizing prism includes a first triangular prism (tp) having a first outer surface (os) to transmit (reflect) the light according to the light's input a direction, and first and second boundary surfaces (bs), a second tp having a second os to transmit the light, a third bs facing the second bs, and a fourth bs, a third tp having a third os to transmit (reflect) the light according the light's input direction, a fifth bs facing the fourth bs, and a sixth bs facing the first bs, and a color separation portion arranged at least one of positions between the second and third bs, the fourth and fifth bs, and the sixth and first bs, to selectively transmit (reflect) the light according to wavelengths thereof.

30 Claims, 9 Drawing Sheets

U.S. PATENT DOCUMENTS

| | | | |
|---|---|---|---|
| 6,604,828 B2 * | 8/2003 | Lu | 353/33 |
| 6,704,144 B2 * | 3/2004 | Huang | 359/634 |
| 6,726,329 B2 * | 4/2004 | Li et al. | 353/20 |
| 7,331,680 B2 * | 2/2008 | Lee et al. | 353/81 |
| 2002/0003609 A1 | 1/2002 | Lu | 353/31 |
| 2002/0114157 A1 * | 8/2002 | Chuang et al. | 362/231 |
| 2002/0181117 A1 | 12/2002 | Huang | 359/634 |
| 2005/0174658 A1 * | 8/2005 | Long et al. | 359/833 |

FOREIGN PATENT DOCUMENTS

| | | |
|---|---|---|
| CN | 2549486 Y | 5/2003 |
| JP | 63-39294 | 2/1988 |
| JP | 2002-244211 | 8/2002 |
| JP | 2004-70017 | 3/2004 |
| JP | 2004-70018 | 3/2004 |
| JP | 2004-158336 | 6/2004 |
| KR | 1999-55244 | 7/1999 |
| KR | 2001-22667 | 3/2001 |
| WO | WO 2004/109366 | 12/2004 |

OTHER PUBLICATIONS

Chinese Office Action dated Sep. 8, 2006 issued in CN 200510088919.1.

* cited by examiner

ILLUMINATION UNIT AND IMAGE PROJECTING APPARATUS EMPLOYING THE SAME

CROSS-REFERENCE TO RELATED APPLICATIONS

This application claims the priority under 35 U.S.C. §119 of Korean Patent Application No. 10-2004-61095, filed on Aug. 3, 2004, in the Korean Intellectual Property Office, the disclosure of which is incorporated herein in its entirety by reference.

BACKGROUND OF THE INVENTION

1. Field of the Invention

The present general inventive concept relates to an illumination unit to illuminate a light beam and an image projecting apparatus, and more particularly, to an illumination unit having an improved prism to synthesize light beams emitted from a compact light source and an image projecting apparatus employing the same.

2. Description of the Related Art

In general, an illumination unit includes a light source emitting a light beam in one direction and an illumination optical system transmitting the light beam. The illumination unit is widely used for an image projecting apparatus that generates an image using an image forming device, such as an LCD device or a digital micromirror device, which cannot generate a light beam by itself.

An illumination unit and an image projecting apparatus adopting a compact light emitting device, such as a light emitting diode (LED) or a laser diode, as a light source have been developed. The compact light emitting device, which can emit each of light beams having red, blue, and green wavelengths, is advantageous in that it does not require an additional color wheel device mechanism to generate a color image in a panel type color image projecting apparatus. In order to emit the respective color light beams, a plurality of compact light emitting devices and a mechanism to synthesize the respective color light beams are needed.

Referring to FIG. 1, an illumination unit emits light beams having red, blue, and green wavelengths and includes first through third LED light sources 11, 12, and 13 arranged at different positions and a trichroic prism 20 which makes light beams emitted from the first through third LED light sources 11, 12, and 13 proceed in the same path.

The trichroic prism 20 includes first through third prisms $P_1$, $P_2$, and $P_3$ that are three individual prisms combined together, a first color filter 21 provided between the first prism $P_1$ and the third prism $P_3$, and a second color filter 25 provided between the second prism $P_2$ and the third prism $P_3$. The first and second color filters 21 and 25 selectively transmit or reflect incident light beams according to the wavelengths thereof. For example, the first color filter 21 reflects a first light beam R having a red wavelength and transmits second and third light beams G and B having green and blue wavelengths, respectively. The second color filter 25 reflects the third light beam B and transmits the second light beam G.

The first light beam R input to the first prism $P_1$ is totally reflected by an exit surface 20a of the first prism P1 according to a critical angle total reflection principle, and then travels toward the first color filter 21. The first light beam R is reflected by the first color filter 21 and passes through the exit surface 20a of the first prism $P_1$ to travel along a path. The second light beam G sequentially passes through the second and first color filters 25 and 21 and proceeds on the same path as the first light beam R. The third light beam B is totally reflected by a surface 20b of the third prism $P_3$ facing the first prism $P_1$ according to the critical angle total reflection principle, travels toward the second color filter 25, is reflected by the second color filter 25, sequentially passes through the third and first prisms $P_3$ and $P_1$, and proceeds on the same path as the first and second light beams R and G. Thus, the first through third light beams R, G, and B emitted from the first through third LED light sources 11, 12, and 13 are synthesized to proceed on the same path with respect to each other.

In the illumination unit configured as described above, to have the third light beam B totally reflected by the surface 20b of the third prism $P_3$, the first prism $P_1$ and the third prism $P_3$ must be separated as much as a predetermined gap $G_{air}$ during the optical arrangement thereof. This is because, when the critical angle total reflection principle is used, there must be not only the angle made between the surface 20b of the third prism $P_3$ and the third light beam B, but also a difference between a refractive index of the third prism $P_3$ and a refractive index therearound. Thus, when the light beams emitted from the plurality of light sources are to be synthesized by using the trichroic prism 20, it is a problem that the optical arrangement of the trichroic prism 20 is difficult.

Also, when the light beams are synthesized by the trichroic prism 20, it may be difficult to install an additional light source emitting a light beam, for example, yellow, magenta, or cyan, in addition to the first through third light sources emitting light beams having different wavelengths such as red, blue, and green, due to the limit in the optical arrangement thereof. Thus, a range of color to be realized may be more limited than in an illuminating unit using a four color light source.

SUMMARY OF THE INVENTION

Accordingly, the present general inventive concept provides an illumination unit in which the configuration of a prism to synthesize light beams emitted by compact light sources is improved, and an image projecting apparatus employing the same.

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept may be achieved by providing an illumination unit comprising a plurality of light source units to emit light beams having different wavelengths, and a synthesizing prism to synthesize incident light beams to make the light beams emitted from the light source units proceed on the same path with respect to each other. The synthesizing prism comprises a first triangular prism having a first outer surface to transmit or reflect the light beams according to a direction in which the light beams are input and first and second boundary surfaces, a second triangular prism having a second outer surface to transmit an incident light beam, a third boundary surface arranged to face the second boundary surface, and a fourth boundary surface, a third triangular prism having a third outer surface to transmit or reflect the light beams according to a direction in which the light beams are input, a fifth boundary surface arranged to face the fourth boundary surface, and a sixth boundary surface arranged to face the first boundary surface, and a color separation portion arranged at least one of positions between the second boundary surface and the third boundary surface, the fourth boundary surface and the fifth boundary surface, and the sixth boundary surface and the first boundary surface, to selectively transmit or reflect according to a wavelength of an incident light beam.

The first, second, and third triangular prisms may have the same shape and size. Each of the first, second and third triangular prisms may be an isosceles triangle in which an angle between two boundary surfaces is 120° and an angle formed between the outer surface and each of the two boundary surfaces is 30°.

The foregoing and/or other aspects and advantages of the present general inventive concept may also be achieved by providing an image projection apparatus comprising the above described illumination unit, an image forming device to form an image corresponding to light beams emitted from the illumination unit, and a projection lens unit to magnify an image formed by the image forming device and to project the magnified image onto a screen.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
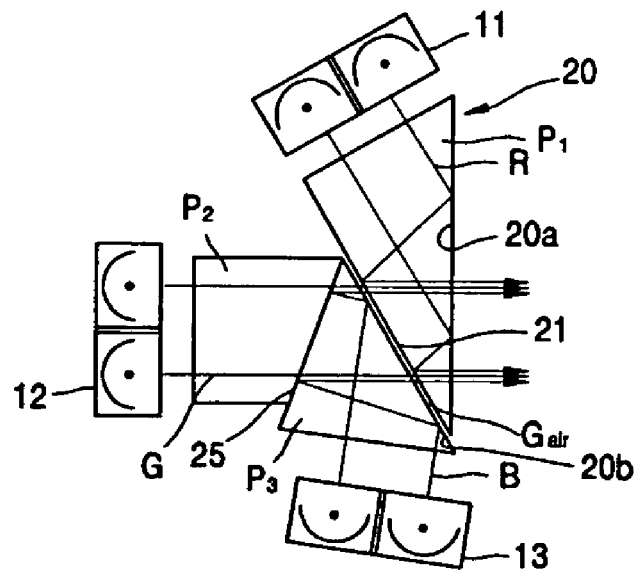
FIG. 1 is a view illustrating an optical arrangement of a comventional illumination unit.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 2:
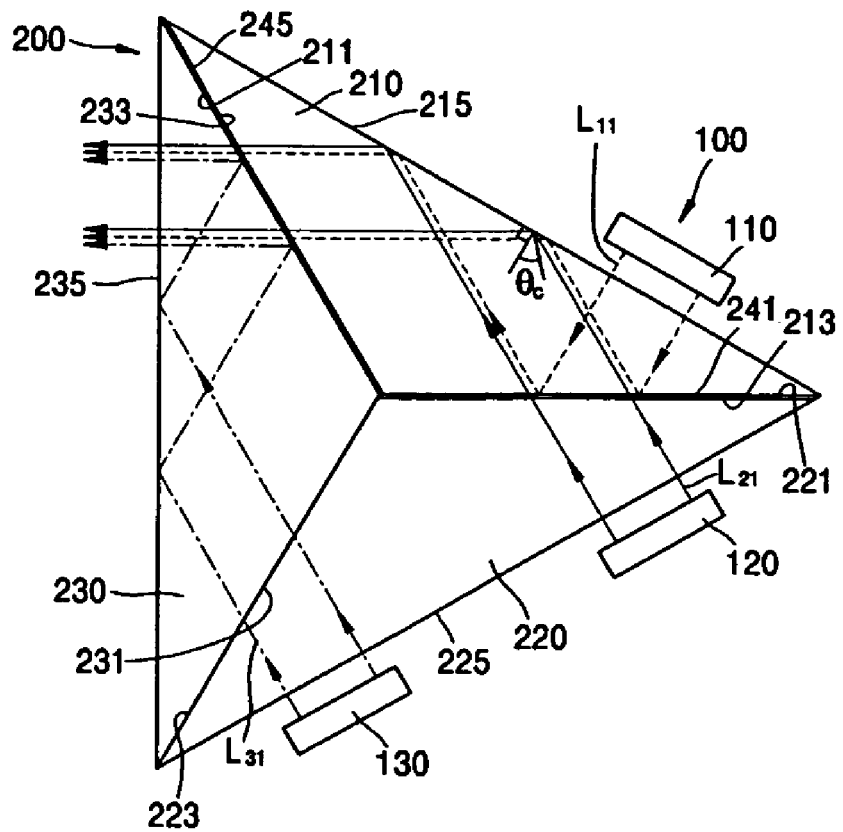
FIG. 2 is a view illustrating an optical arrangement of an illumination unit according to an embodiment of the present general inventive concept.

FIG. 2 illustrates an illumination unit according to an embodiment of the present general inventive concept. Referring to FIG. 2, the illumination unit includes a plurality of light source units 100 to emit light beams having different wavelengths and a synthesizing prism 200 to synthesize incident light beams so that each of the light beams emitted from the plurality light source units 100 proceeds on the same path.

The plurality of light source units 100 includes first, second, and third light source units 110, 120, and 130 arranged at different positions and having a difference in wavelengths among light beams emitted therefrom. That is, the first, second, and third light source units 110, 120, and 130 emit first, second, and third light beams $L_{11}$, $L_{21}$, and $L_{31}$ having different wavelengths, for example, light beams having green, blue, and red wavelengths, respectively.

The synthesizing prism 200 having a triangular column shape includes first, second, and third triangular prisms 210, 220, and 230, each having an outer surface which transmits or totally reflects a light beam according to a direction in which the light beam is incident, and two boundary surfaces coupled to the other two triangular prisms. A color separation portion is provided at at least one boundary between the first, second, and third triangular prisms 210, 220, and 230 to selectively transmit and reflect according to the wavelength of an incident light beam.

The first triangular prism 210 has first and second boundary surfaces 211 and 213 and a first outer surface 215 that transmits or reflects an incident light beam according to the direction in which the light beam is incident.

The first light source unit 110 is arranged to face the first outer surface 215. Thus, the first light beam $L_{11}$ emitted from the first light source unit 110 is directly transmitted through the first outer surface 215 and proceeds toward the second boundary surface 213. The first and second light beams $L_{11}$ and $L_{21}$ incident on the first outer surface 215 at an angle over a critical angle $\theta c$ from the second boundary surface 213 are totally reflected by the first outer surface 215 and proceed toward the first boundary surface 211. Then, the first and second light beams $L_{11}$ and $L_{21}$ are transmitted through a third outer surface 235 of the third triangular prism 130, which is described later, and proceed on the same path.

The total reflection occurs on the conditions that the refractive index of the first triangular prism 210 is greater than the refractive index of a portion therearound and the first and second light beams $L_{11}$ and $L_{21}$ are incident at an angle greater than the critical angle $\theta c$ inside the first triangular prism 210.

The second triangular prism 220 has third and fourth boundary surfaces 221 and 223 and a second outer surface 225 to transmit an incident light beam. The third boundary surface 221 is arranged to face the second boundary surface 213 of the first triangular prism 210.

The second and third light source units 120 and 130 are arranged to face the second outer surface 225. The second light beam $L_{21}$ emitted from the second light source unit 120 is transmitted through the second outer surface 225 to proceed toward the third boundary surface 221 while the third light beam $L_{31}$ emitted from the third light source unit 130 is transmitted through the second outer surface 225 to proceed toward the fourth boundary surface 223.

The third triangular prism 230 has fifth and sixth boundary surfaces 231 and 233 and the third outer surface 235 to transmit or reflect an incident light beam according to the direction in which the light beam is incident. The fifth boundary surface 231 is arranged to face the fourth boundary surface 223 of the second triangular prism 220 while the sixth boundary surface 233 is arranged to face the first boundary surface 211 of the first triangular prism 210. Thus, the third light beam $L_{31}$ emitted from the third light source unit 130 is totally reflected by the third outer surface 235 and proceeds toward the sixth boundary surface 233. The third light beam $L_{31}$ is then totally reflected by the sixth boundary surface 233. The first, second, and third light beams $L_{11}$, $L_{21}$, and $L_{31}$ coming from the sixth boundary surface 233 are transmitted through the third outer surface 235 and proceed on the same path.

The first, second, and third triangular prisms 210, 220, and 230 have the same shape and size so that the first, second, and third light beams $L_{11}$, $L_{21}$, and $L_{31}$ input from different positions proceed on the same path with respect to each other. The first triangular prism 210 can be an isosceles triangle in which an angle between the first boundary surface 211 and the second boundary surface 213 is 120°, while an angle between the first boundary surface 211 and the first outer surface 215 and an angle between the second boundary surface 213 and the first outer surface 215 are each 30°. Likewise, the second and third triangular prisms 220 and 230 are prisms having an isosceles triangle shape and the same conditions as those of the first triangular prism 210. The second and third triangular prisms 220 and 230 may be formed in a single monolithic body which does not have the fourth and fifth boundary surfaces 223 and 231.

The color separation portion is arranged at at least one of positions between the second boundary surface 213 and the third boundary surface 221, the fourth boundary surface 223 and the fifth boundary surface 231, and the sixth boundary surface 233 and the first boundary surface 211. In the embodiment of FIG. 2, the color separation portion may include first and second dichroic filters 241 and 245 provided between the second boundary surface 213 and the third boundary surface 221, and the sixth boundary surface 233 and the first boundary surface 211, respectively.

The first dichroic filter 241 reflects the first light beam $L_{11}$ in a first wavelength range emitted from the first light source unit 110 and transmits the second light beam $L_{21}$ in a second wavelength range emitted from the second light source unit 120. For example, with respect to a predetermined wavelength between green and blue colors, for example, a 500 nm wavelength, a light beam in a relatively longer wavelength range is reflected and a light beam in a relatively shorter wavelength range is transmitted. Thus, when the first light beam $L_{11}$ is a light beam in a green wavelength range and the second light beam $L_{21}$ is a light beam in a blue wavelength range, the first light beam $L_{11}$ is reflected by the first dichroic filter 241 and the second light beam $L_{21}$ is transmitted through the first dichroic filter 241 and proceeds on the same path as the first light beam $L_{11}$.

The second dichroic filter 245 reflects the third light beam $L_{31}$ in a third wavelength range, for example, a red wavelength range, and transmits the first and second light beams $L_{11}$ and $L_{21}$ in other wavelength ranges. For example, with respect to a predetermined wavelength between red and green colors, for example, a 565 nm wavelength, a light beam in a relatively longer wavelength range is reflected and a light beam in a relatively shorter wavelength range is transmitted. Thus, when the first and second light beams $L_{11}$ and $L_{21}$ are light beams in the green and blue wavelength ranges and the third light beam $L_{31}$ is a light beam in the red wavelength range, the first and second light beams $L_{11}$ and $L_{21}$ are transmitted through the second dichroic filter 245 and the third light beam $L_{31}$ is reflected by the third dichroic filter 245 and proceeds on the same path as the first and second light beams $L_{11}$ and $L_{21}$.

Figure 3:
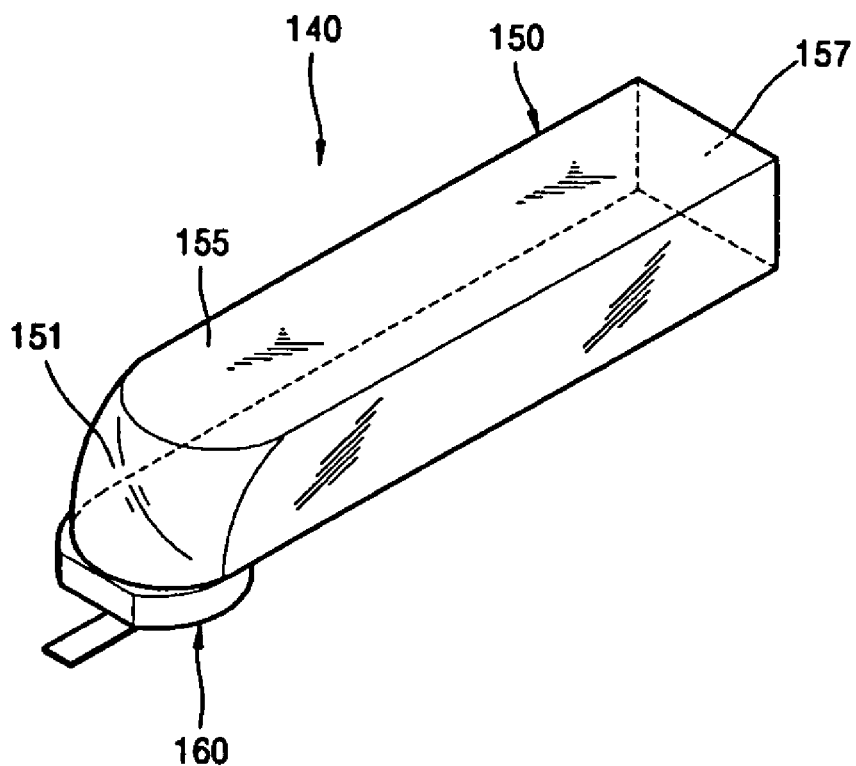
FIG. 3 is a perspective view illustrating a light source unit of the illustrating unit of FIG. 2.
Figure 4:
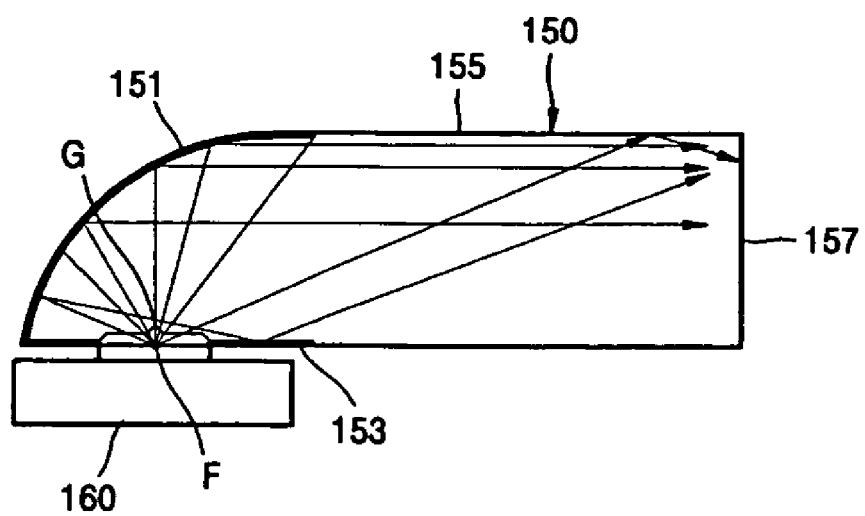
FIG. 4 is a side view illustrating the light source unit of the illustration unit of FIG. 2.
Figure 5:
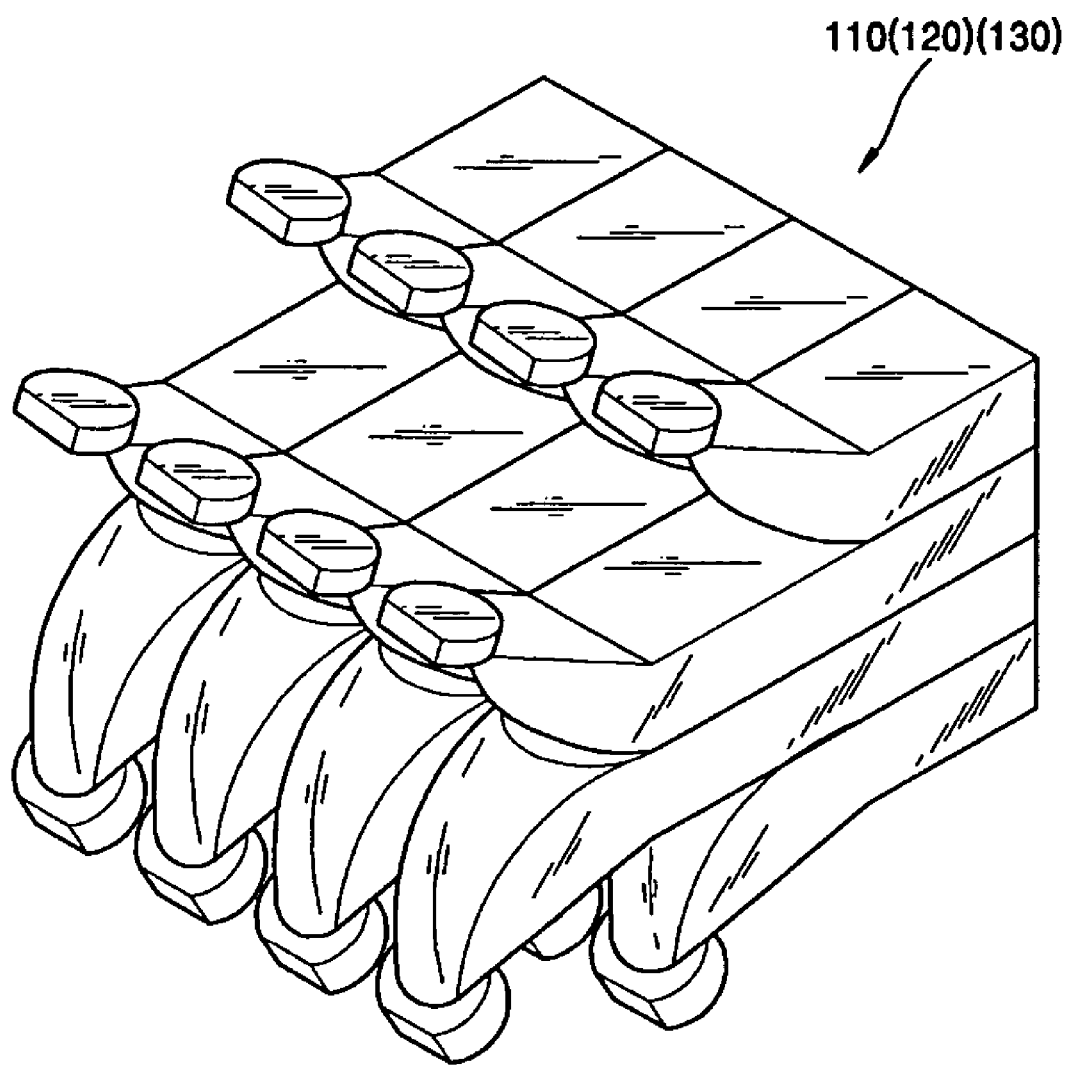
FIG. 5 is a perspective view illustrating another example of the light source unit of the illustration unit FIG. 2.

Each of the first, second, and third light source units 110, 120, and 130 is formed of at least one optical module 140, as illustrated in FIGS. 3 through 5.

Referring to FIGS. 3 through 5, the optical module 140 includes a collimator 150 having a reflection surface and a light source 160 to emit a light beam having a predetermined wavelength. The collimator 150 includes a first reflection surface 151 having a parabolic surface and a glass rod 155 having a rectangular section. The light source 160 is a compact light source having at least one light emitting diode (LED) or a laser diode and a light emitting portion thereof is located on and around a focus F of the first reflection surface 151. The first reflection surface 151 is formed by processing part of the glass rod 155 into the parabolic surface and reflection-coating an outside portion of the parabolic surface. The collimator 150 can further have a second reflection surface 153 formed at a portion of the collimator 150 facing the first reflection surface 151. The second reflection surface 153 is formed by reflection-coating the portion of the collimator 150 except for an area G where the light beam directly emitted from the light source 160 passes.

A light beam within a predetermined radiation angle range of the light beam emitted from the light source 160 is reflected by the first reflection surface 151 and becomes a parallel beam. The parallel beam passes inside the glass rod 155 and through an exit surface 157. In the meantime, since the light emitting portion of the light source 160 does not form a point but has a predetermined area, all of the light emitting portion cannot be arranged at the focus F. Thus, part of the light beam emitted from the light source 160 is reflected by the first reflection surface 151 and proceeds toward the second reflection surface 153. The second reflection surface 153 reflects the incident light beam to proceed toward the exit surface 157. Here, each exit surface 157 may be disposed to face a corresponding one of the first, second, and third outer surfaces 215, 225, and 235 of the synthesizing prism 200.

Since the optical module 140 collimates the light beam emitted from the light source 160 using the first reflection surface 151 instead of a lens, a problem of an efficiency being lowered due to a principle limitation, such as etendue, generated when the lens is used can be thoroughly solved.

Although the collimator 150 using the glass rod 155 is described above, the present general inventive concept is not limited thereto and it is possible to form a parabolic surface at one side of an optical tunnel (not shown) having a hallow instead of the glass rod 155 and a reflection surface by reflection-processing the inside of the optical tunnel.

In the illumination unit of FIG. 2, each of the first, second, and third light source units 110, 120, and 130 can be formed of a plurality of the optical modules 140 arranged in an array, as illustrated in FIG. 5. In this case, each of the optical modules 140 forming each of the first, second, and third light source units 110, 120, and 130 emits a light beam having a red, green, or blue wavelength. Thus, by simultaneously or sequentially driving the first, second, and third light source units 110, 120, and 130 to emit the respective light beams, a full color light beam formed by a combination of these light beams can be emitted. Furthermore, a color light beam can be illuminated without a color wheel to generate color when the illumination unit described above is applied to an image projecting apparatus that is described later.

In the illumination unit configured as described above, since the light beams emitted from the first, second, and third light source units 110, 120, and 130 are synthesized using the synthesizing prism 200 having a triangle prism structure, an optical path can be easily changed using a critical angle total reflection principle and the optical arrangement is made easy as compared to a conventional trichroic prism structure.

Figure 6:
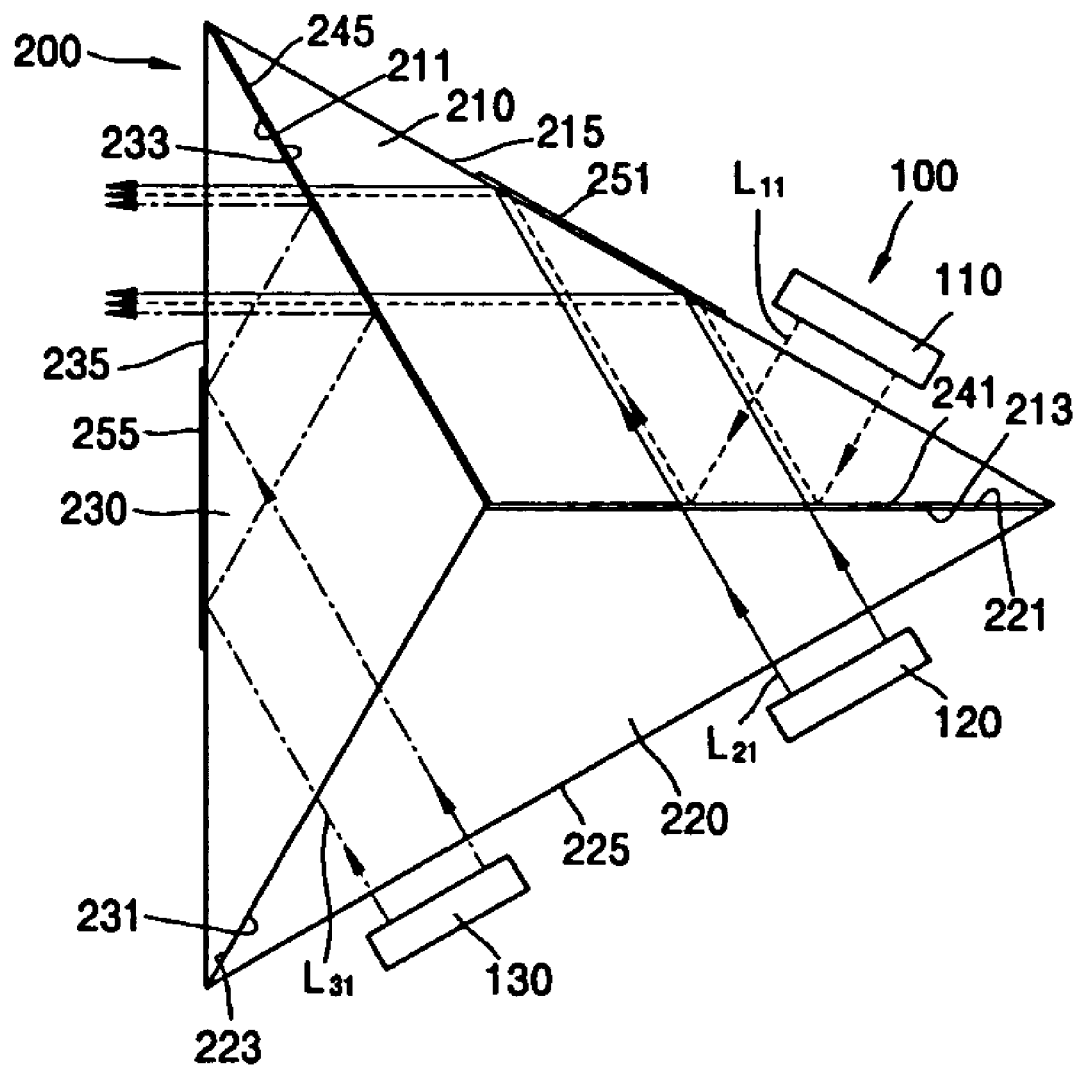
FIG. 6 is a view illustrating an optical arrangement of an illumination unit according to another embodiment of the present general inventive concept.

FIG. 6 is a view illustrating an optical arrangement of an illumination unit according to another embodiment of the present general inventive concept. Referring to FIG. 6, the illumination unit includes the plurality of the light source units 100 to emit light beams having different wavelengths and the synthesizing prism 200 to synthesize incident light beams so that each of the light beams emitted from the light source units 100 proceed on the same path.

In the embodiment of FIG. 6 as compared to the embodiment of FIG. 2, in consideration of a total reflection property of the synthesizing prism 200 at the first and third side surfaces 215 and 235, first and second reflection layers 251 and 255 are further provided. However, since the configuration and arrangement of other constituent elements except for the above layers 251 and 255 are substantially the same as those of the illumination unit of FIG. 2, detailed descriptions thereof will be omitted herein.

The first reflection layer 251 is formed by total reflection-coating a portion of the first outer surface 215 to totally reflect the first and second light beams $L_{11}$ and $L_{21}$ reflected by or passing through the first dichroic filter 241. Since the first reflection layer 251 is not formed at a portion of the first outer surface 215 where the first light beam $L_{11}$ is directly emitted from the first light source unit 110, it does not influence the procession of the first light beam $L_{11}$ toward the first dichroic filter 241.

The second reflection layer 255 is formed by total reflection-coating a portion of the third outer surface 235 to reflect the third light beam $L_{31}$ directly emitted from the third light source unit 130. Since the second reflection layer 255 is not formed on an optical path along which the first, second, and third light beams $L_{11}$, $L_{21}$, and $L_{31}$ passing through or reflected by the second dichroic filter 245 proceed, it does not influence the procession of the first, second, and third light beams $L_{11}$, $L_{21}$, and $L_{31}$ through the third outer surface 235. When the first and second reflection layers 251 and 255 are formed on the synthesizing prism 200, the incident beams may not necessarily be incident at the angle greater than the critical angle θc.

Figure 7:
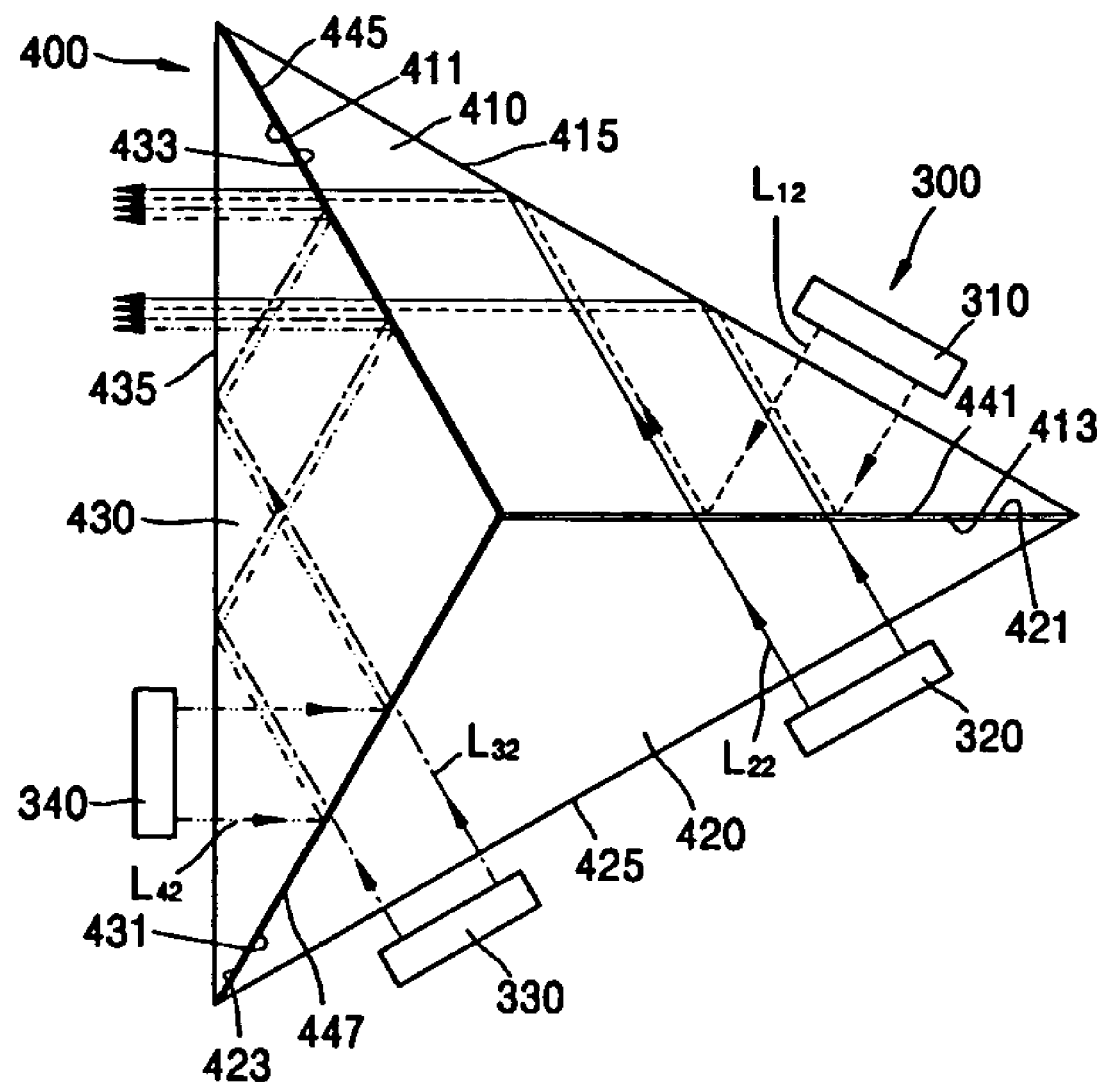
FIG. 7 is a view illustrating an optical arrangement of an illumination unit according to yet another of the present general inventive concept.

FIG. 7 is a view illustrating an optical arrangement of an illumination unit according to yet another embodiment of the present general inventive concept. Referring to FIG. 7, the illumination unit includes a plurality of light source units 300 to emit light beams having different wavelengths and a synthesizing prism 400 to synthesize incident light beams so that each of the light beams emitted from the light source units 300 proceed on the same path.

The light source units 300 include first, second, third, and fourth light source units 310, 320, 330, and 340 arranged at different positions and having a difference in wavelengths of light beams emitted therefrom. That is, the first, second, third, and fourth light source units 310, 320, 330, and 340 emit first, second, third, and fourth light beams $L_{12}$, $L_{22}$, $L_{32}$, and $L_{42}$ having different wavelengths, for example, light beams having green, blue, red, and yellow wavelengths, respectively. Since the configuration of each of the first, second, third, and fourth light source units 310, 320, 330, and 340 is the same as those described with reference to FIGS. 3 through 5, detailed descriptions thereof are omitted herein.

The synthesizing prism 400 has a triangular column shape and includes first, second, and third triangular prisms 410, 420, and 430, each having an outer surface to transmit or totally reflect a light beam according to a direction in which the light beam is incident, and two boundary surfaces coupled to the other two triangular prisms. A color separation portion is provided at at least one of the boundaries among the first, second, and third triangular prisms 410, 420, and 430 to selectively transmit or reflect according to the wavelength of an incident light beam.

The first triangular prism 410 includes first and second boundary surfaces 411 and 413 and a first outer surface 415 which transmits or reflects an incident light beam according to the wavelength of the light beam. The second triangular prism 420 includes third and fourth boundary surfaces 421 and 423 and a second outer surface 425 which transmits an incident light beam. The third triangular prism 430 includes fifth and sixth boundary surfaces 431 and 433 and a third outer surface 435 which transmits or reflects an incident light beam according to the wavelength of the light beam. The arrangement of each of the first, second, and third triangular prisms 410, 420, and 430 and the arrangement of the first, second, and third light source units 310, 320, and 330 with respect thereto are substantially the same as the arrangement of the first, second, and third triangular prisms 210, 220, and 230 and the first, second, and third light source units 110, 120, and 230 of FIG. 2.

The fourth light source unit 340 is arranged to face the third outer surface 435. Thus, the fourth light beam $L_{42}$ emitted from the fourth light source unit 340 is transmitted through the third outer surface 435 to proceed toward the fifth boundary surface 431.

In the embodiment of FIG. 7, the color separation portion includes first, second, and third dichroic filters 441, 445, and 447 provided between the second boundary surface 413 and the third boundary surface 421, the sixth boundary surface 433 and the first boundary surface 411, and the fourth boundary surface 423 and the fifth boundary surface 431, respectively.

The third dichroic filter 447 is provided to separate the third light beam $L_{32}$ and the fourth light beam $L_{42}$ emitted from the third and fourth light source units 330 and 340, respectively. The third dichroic filter 447 transmits the third light beam $L_{32}$ in a third wavelength range emitted from the third light source unit 440 and reflects the fourth light beam $L_{42}$ in a fourth wavelength range emitted from the fourth light source unit 440. For example, with respect to a predetermined wavelength between red and yellow colors, for example, 600 nm, a light beam in a relatively longer wavelength range is transmitted while a light beam in a relatively shorter wavelength range is reflected. Thus, when the third light beam $L_{32}$ is a light beam in a red wavelength range and the fourth light beam $L_{42}$ is a light beam in a yellow wavelength range, the third light beam $L_{32}$ is transmitted by the third dichroic filter 447 while the fourth light beam $L_{42}$ is reflected so that both light beams proceed along the same path.

Since the first and second dichroic filters 441 and 445 perform substantially the same operations as the first and second dichroic filters 241 and 245 of FIG. 2, detailed descriptions thereof are omitted herein. The second dichroic filter 445 transmits the first and second light beams $L_{12}$ and $L_{22}$ and reflects the third and fourth light beams $L_{32}$ and $L_{42}$ so that these light beams proceed along the same path.

The fourth light beam $L_{42}$ is not limited to the light beam having a yellow wavelength but can be altered to light beams having various wavelengths in order to widen a color range of the illumination unit. For example, a light source unit to emit a light beam having a magenta or cyan wavelength may be included. In addition, although the first, second, third, and fourth light beams $L_{12}$, $L_{22}$, $L_{32}$, and $L_{42}$ are described above as emitting light beams having green, blue, red, and yellow wavelengths, the present general inventive concept is not limited thereto. That is, a variety of modifications are possible by altering the arrangement of the first through third dichroic filters.

In the illumination unit of FIG. 7, by synthesizing the light beams emitted from the first, second, third, and fourth light source units 310, 320, 330, and 340 using the triangular prism type synthesizing prism 400, the optical path can be easily changed using the critical angle total reflection principle and the optical arrangement is made easy as compared to the structure of the conventional trichroic prism. Also, since an image is realized by the combination of four colors, a range of color to be presented is widened.

Figure 8:
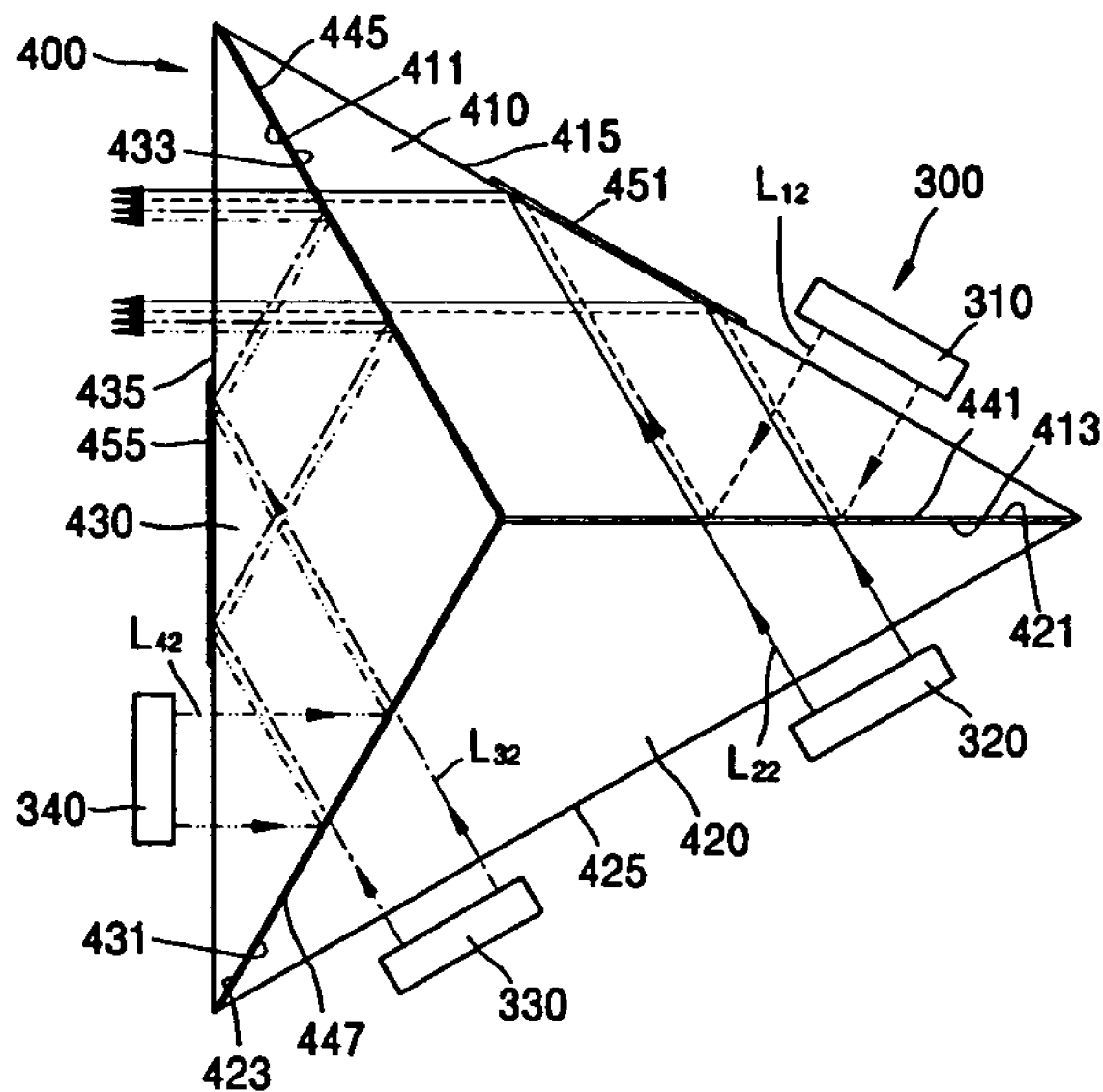
FIG. 8 is a view illustrating an optical arrangement of an illumination unit according to still another embodiment of the present general inventive concept.

FIG. 8 is a view illustrating an optical arrangement of an illumination unit according to still another embodiment of the present general inventive concept. Referring to FIG. 8, the illumination unit includes the plurality of the light source units 300 to emit light beams having different wavelengths and the synthesizing prism 400 to synthesize incident light beams so that each of the light beams emitted from the light source unit 300 proceed on the same path.

The illumination unit of FIG. 8 is similar to the illumination unit of FIG. 7, and further includes first and second reflection layers 451 and 455 to enhance the total reflection property at the first and third outer surfaces 415 and 435 of the synthesizing prism 400. Since the configuration and arrangement of the other constituent elements are substantially the same as those of the illumination unit of FIG. 7, detailed descriptions thereof are omitted herein.

The first reflection layer 451 is formed by total reflection-coating a portion of the first outer surface 415 to totally reflect the first and second light beams $L_{12}$ and $L_{22}$ reflected by or passing through the first dichroic filter 441. Since the first reflection layer 451 is not formed at a portion of the first outer surface 415 where the first light beam $L_{12}$ is directly emitted from the first light source unit 310, the first reflection layer 451 does not influence the procession of the first light beam $L_{12}$ toward the first dichroic filter 441.

The second reflection layer 455 is formed by total reflection-coating a portion of the third outer surface 435 to reflect the third and fourth light beams $L_{32}$ and $L_{42}$ reflected by or passing through the third dichroic filter 447. Since the second reflection layer 455 is not formed on an optical path along which the first, second, third, and fourth light beams $L_{12}$, $L_{22}$, $L_{32}$, and $L_{42}$ which pass through or are reflected by the second dichroic filter 445 proceed, it does not influence the procession of the first, second, third, and fourth light beams $L_{12}$, $L_{22}$, $L_{32}$, and $L_{42}$.

Figure 9:
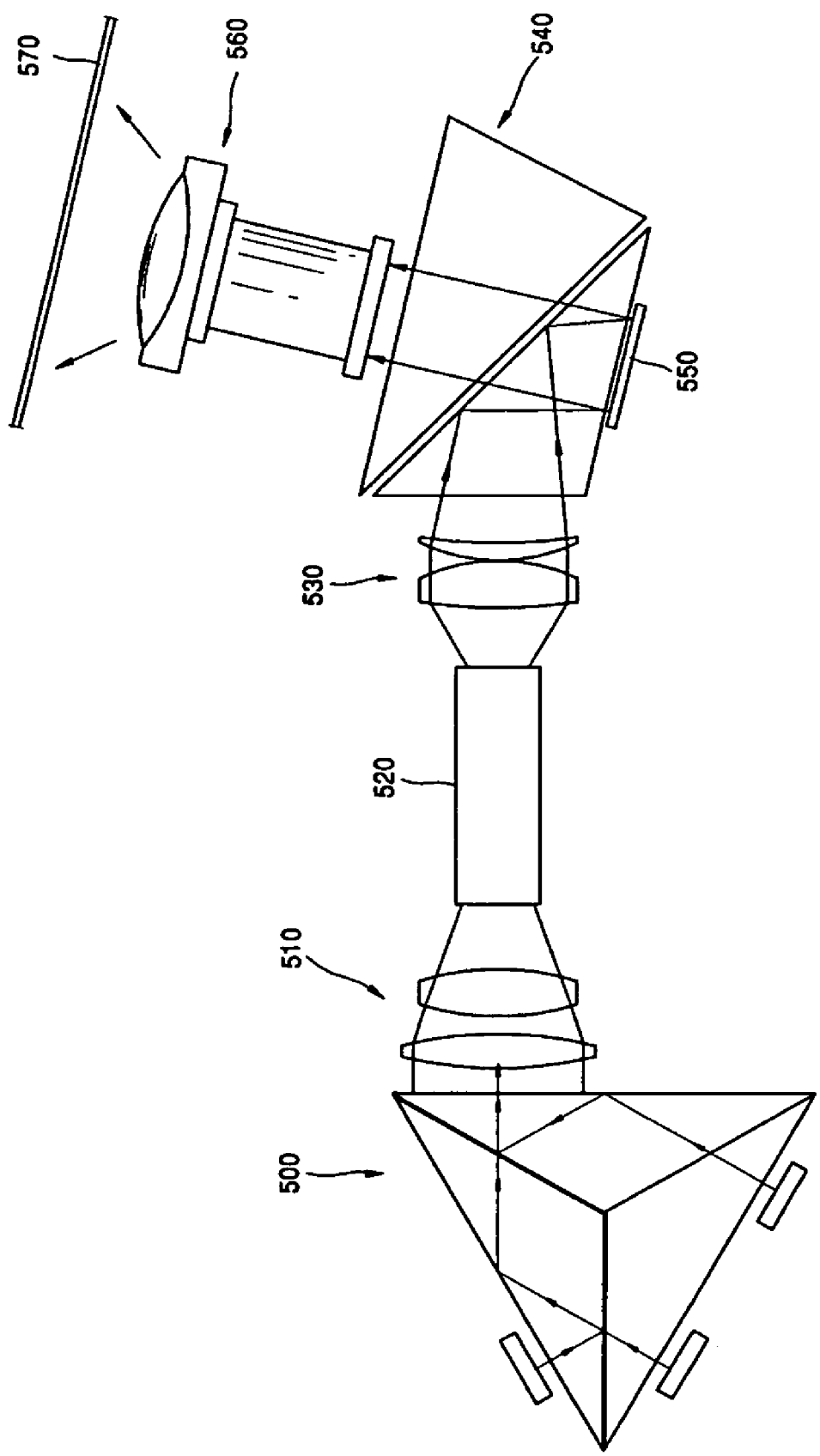
FIG. 9 is a view illustrating an optical arrangement of an image projecting apparatus according to an embodiment of the present general inventive concept.

FIG. 9 is a view illustrating an optical arrangement of an image projecting apparatus according to an embodiment of the present general inventive concept. Referring to FIG. 9, the image projecting apparatus includes an illumination unit 500, an image forming device 550 to form an image corresponding to an image signal of a light beam emitted from the illumination unit 500, and a projection lens unit 560 to magnify and project the image formed by the image forming device 550 onto a screen 570.

The illumination unit 500 includes a plurality of light source units and a synthesizing prism to synthesize a plurality of light beams emitted from the light source units and to emit a light beam by synthesizing the light beams emitted from the light source units arranged at different positions. Since the configuration of the illumination unit 500 is substantially the same as one of the illumination units of FIGS. 2, 6, 7, and 8, a detailed description thereof is omitted herein. The light source units of the illumination unit 500, which are driven to be sequentially turned on and off, sequentially emit three or more color light beams such as light beams having green, blue, and red wavelengths or light beams having green, blue, red, and yellow (or magenta or cyan) wavelengths. Thus, in forming an image projecting apparatus using a one-panel type image forming device, the illumination unit 500 can replace a color wheel (not shown) used in generating a color image.

The image forming device 550 forms an image by selectively reflecting an incident uniform illumination light beam by units of pixels. The image forming device 550 may be a reflection type liquid crystal display (LCD) device, a transmission type LCD device, or a digital micromirror device (DMD). While the reflection type LCD device and the transmission type LCD device generate an image using a polarization property of an incident light beam, the DMD does not use the polarization property. Thus, when the DMD is used as the image forming device 550, an additional polarization conversion device or a polarizer is not needed.

As illustrated in FIG. 9, the DMD is used as the image forming device 550. The DMD includes a micromirror array in two dimensions, in which micromirrors are independently driven, and forms an image by independently setting an angle of reflection of a light beam for each pixel according to an input image signal. In this case, as a unit to change a path of an incident light beam, a beam splitter 540 is further provided between the image forming device 550 and the projection lens unit 560. The beam splitter 540 changes a path of the incident light beam such that a light beam coming from the illumination unit 500 proceeds toward the image forming device 550 and a light beam coming from the image forming device 550 proceeds toward the screen 570. The beam splitter 540 is a critical angle prism which changes the path of a light beam using the critical angle total reflection property.

The projection lens unit 560 is arranged to face the beam splitter 540 and magnifies an image formed by the image forming device 550 and passing through the beam splitter 540 and projects the magnified image toward the screen 570.

The image projecting apparatus, as illustrated in FIG. 9, further includes an optical integrator 520, to make the light beam emitted from the illumination unit 500 a parallel beam, arranged between the illumination unit 500 and the beam splitter 540. The optical integrator 520 may be a glass rod having a cubic shape in which the light beam travels therein while being totally reflected. In this case, a condensing lens unit 510 to consider an incident light is further provided between the light source unit 500 and the optical integrator 520. The condensing lens unit 510 is formed of at least one lens unit and condenses an incident parallel beam to be incident on the glass rod.

The image projecting apparatus further includes a relay lens unit 530 arranged between the optical integrator 520 and the beam splitter 540. The relay lens unit 530 is formed of at least one lens to relay a uniform light beam output from the glass rod to the DMD (image forming device 550) that is in an image forming position.

Figure 10:
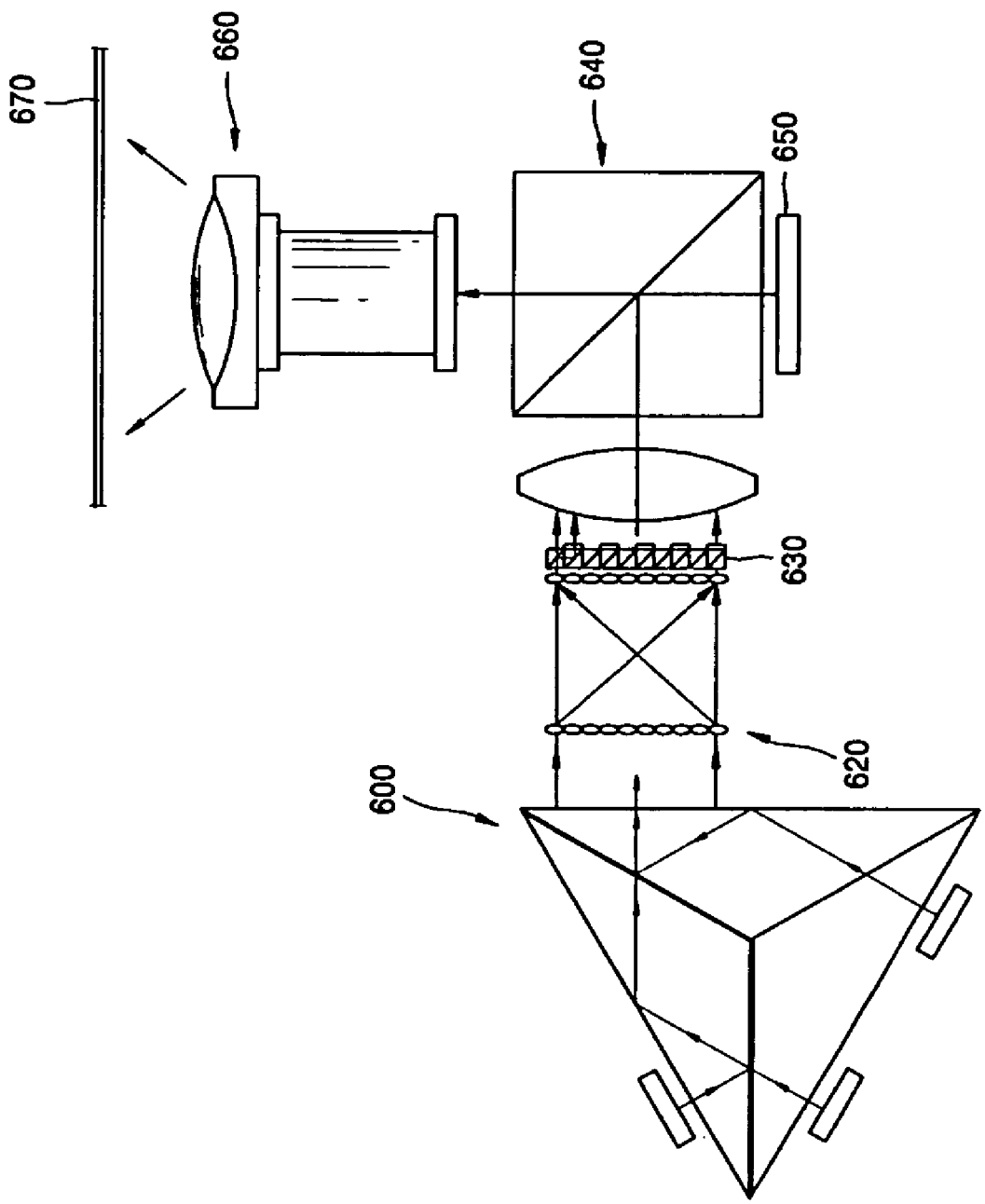
FIG. 10 is a view illustrating an optical arrangement of an image projecting apparatus according to another embodiment of the present general inventive concept.

FIG. 10 is a view illustrating an optical arrangement of an image projecting apparatus according to another embodiment of the present general inventive concept. Referring to FIG. 10, the image projecting apparatus includes an illumination unit 600, an image forming device 650 to form an image corresponding to an image signal of a light beam emitted from the illumination unit 600, and a projection lens unit 660 to magnify and project the image formed by the image forming device 650 onto a screen 670. Since the configuration of the illumination unit 600 is substantially the same as one of the illumination units of to FIGS. 2, 6, 7, and 8, a detailed description thereof is omitted herein.

The image forming device 650 forms an image by selectively reflecting incident uniform illuminated light by units of pixels. As illustrated in FIG. 10, a reflection type LCD device to generate an image utilizing a polarization property of an incident light beam is used as the image forming device 650.

In this case, as a unit to change a path of the incident light beam, the projecting apparatus further includes a polarization beam splitter 640 arranged between the illumination unit 600, the image forming device 650, and the projection lens unit 660. The polarization beam splitter 640 changes a path of the incident light beam such that the incident light beam coming from the illumination unit 600 proceeds toward the image forming device 650 and the incident light beam coming from the image forming device 650 proceeds toward the screen 670. To this end, a polarization changing device 630 to change a direction of the polarization of an incident light beam to allow a light beam having a particular polarization to proceed toward the polarization beam splitter 640 is arranged between the illumination unit 600 and the polarization beam splitter 640. The polarization changing device 630 includes a plurality of compact polarization beam splitters and a quarter wave plate and changes most of a non-polarized incident light beam to a light beam having a particular polarization. Since the configuration of the polarization changing device 630 is well known, a detailed description thereof is omitted herein.

The image projecting apparatus further includes an optical integrator 620 to make the light beam emitted from the illumination unit 600 into a uniform light beam. The optical integrator 620 is formed of a fly-eye lens array including at least one fly-eye lens that includes each of a plurality of lens cells having a convex or cylindrical shape arranged to neighbor one another.

Figure 11:
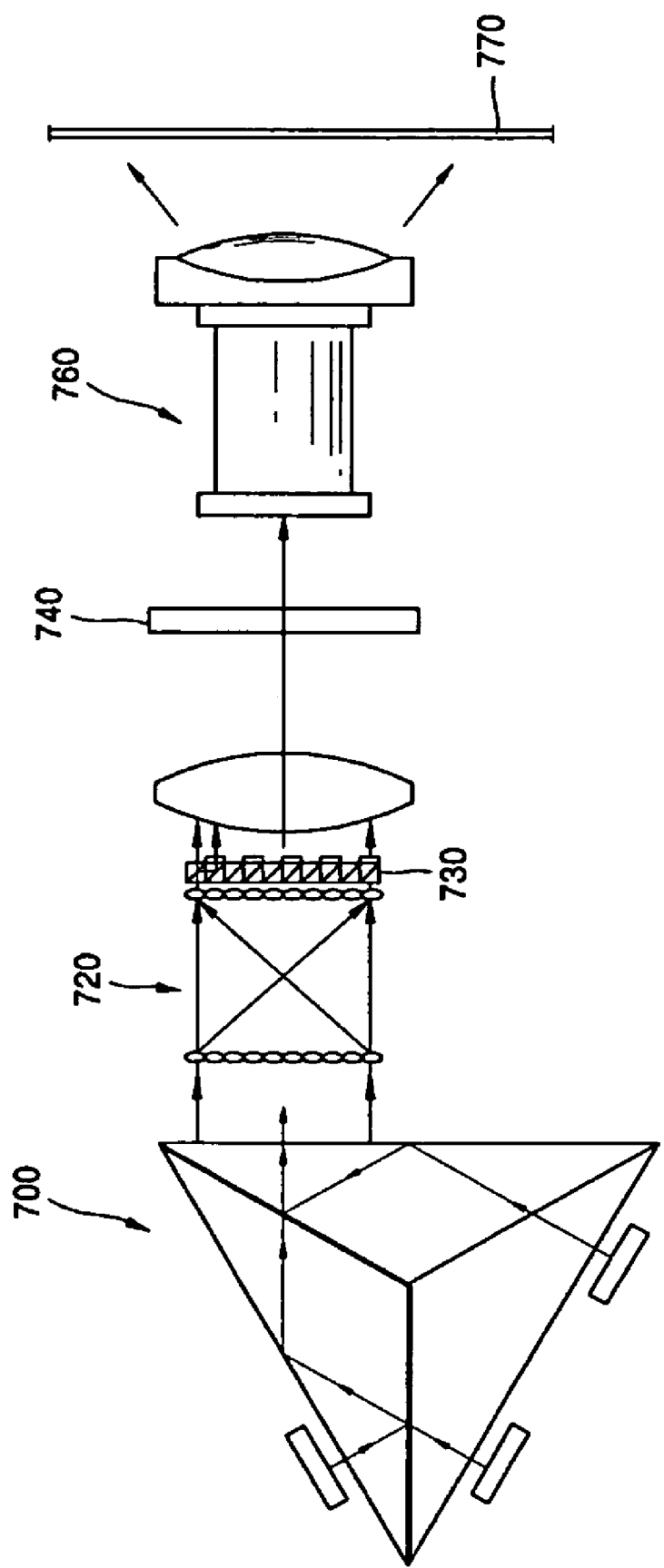
FIG. 11 is a view illustrating the optical arrangement of an image projecting apparatus according to yet another embodiment of the present general inventive concept.

FIG. 11 is a view illustrating an optical arrangement of an image projecting apparatus according to yet another embodiment of the present general inventive concept. Referring to FIG. 11, the image projecting apparatus includes an illumination unit 700, an image forming device 740 to form an image corresponding to an image signal of a light beam emitted from the illumination unit 700, and a projection lens unit 760 to magnify and project an image formed by the image forming device 740 onto a screen 770. Since the configuration of the illumination unit 700 is substantially the same as one of the illumination units of FIGS. 2, 6, 7, and 8, a detailed description thereof is omitted herein.

The image forming device 740 forms an image by selectively reflecting incident uniform illuminated light by units of pixels. As illustration in FIG. 11, a transmission type LCD device to generate an image utilizing a polarization property of an incident light beam is used as the image forming device 740. In this case, since a unit to change a path of the incident light beam is not necessary, it is advantageous that a beam splitter is not required, unlike the image projecting apparatuses of FIGS. 9 and 10.

Since the transmission type LCD device forms an image using a polarization property, a polarization changing device 730 is further provided between the illumination unit 700 and the image forming device 740. Also, the image projecting apparatus further includes an optical integrator 720 to make an incident light beam emitted from the illumination unit 700 a uniform light beam. The optical integrator 720 is formed of a fly-eye lens array including at least one fly-eye lens unit that includes each of a plurality of lens cells having a convex or cylindrical shape arranged to neighbor one another.

In an illumination unit, according to the present general inventive concept, since light beams emitted from first, second, and third light source units are synthesized by using a synthesizing prism having a triangle prism structure, a path of the light beams can be easily changed using a critical angle total reflection principle and an optical arrangement is made easy as compared to a conventional trichroic prism structure. Also, in forming a light source unit, since a light beam is collimated by using a reflection surface instead of a lens, a problem of an efficiency being lowered due to a principle limitation, such as etendue, generated when the lens is used can be thoroughly solved. When an additional light source unit to emit a fourth light beam is provided, a range of color to be presented can be widened and light beams of a variety of colors can be illuminated.

Furthermore, since an image projecting apparatus according to the present general inventive concept includes the illumination unit, the structure thereof can be made compact. Also, since a color light beam is illuminated by using the first, second, and third light source units to illuminate light beams having different wavelengths, a color image can be generated without an additional color wheel.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An illumination unit comprising:
   a plurality of light source units to emit light beams having different wavelengths; and
   a synthesizing prism to synthesize the light beams emitted from the light source units to proceed on the same path with respect to each other, the synthesizing prism comprising:
      a first triangular prism comprising a first outer surface to transmit or reflect a first portion of the light beams according to a direction in which the light beams are input, and first and second boundary surfaces,
      a second triangular prism comprising a second outer surface to transmit a second portion of the light beams, a third boundary surface arranged to face the second boundary surface, and a fourth boundary surface,
      a third triangular prism comprising a third outer surface to transmit or reflect the first and second portions of the light beams according to a direction in which the light beams are input, a fifth boundary surface arranged to face the fourth boundary surface, and a sixth boundary surface arranged to face the first boundary surface, and
      a color separation portion arranged at least one of positions between the second boundary surface and the third boundary surface, the fourth boundary surface and the fifth boundary surface, and the sixth boundary surface and the first boundary surface, to selectively transmit or reflect the light beams according to a wavelength of each light beam;
   wherein the plurality of light units comprises:
      a first light source unit arranged to face the first outer surface to emit the first light beam toward the second boundary surface, and
      a second light source unit arranged to face the second outer surface to emit the second light beam toward the third boundary surface.

2. The illumination unit as claimed in claim 1, wherein the first, second, and third triangular prisms have the same shape and size with respect to each other.

3. The illumination unit as claimed in claim 2, wherein each of the first, second, and third triangular prisms is an isosceles triangle in which an angle between the two boundary surfaces is 120° and an angle formed between the outer surface and each of the two boundary surfaces is 30°.

4. The illumination unit as claimed in claim 1, wherein each of the plurality of light source units comprises at least one optical module to emit a parallel beam and including a collimator having a reflection surface and a light source to emit a corresponding one of the light beams having a corresponding one of the wavelengths disposed at a surface opposite to the reflection surface.

5. The illumination unit as claimed in claim 4, wherein the light source is formed of one or more LED light sources or laser diodes forming an array.

6. The illumination unit as claimed in claim 1, wherein the light beams comprise first, second, and third light beams, and the color separation portion comprises:
   a first dichroic filter arranged between the second boundary surface and the third boundary surface to reflect the first light beam in a first wavelength range and to transmit the second light beam in a second wavelength range; and
   a second dichroic filter arranged between the sixth boundary surface and the first boundary surface to reflect the third light beam in a third wavelength range and to transmit the first and second light beams in a second wavelength range.

7. The illumination unit as claimed in claim 6, wherein the plurality of light source units comprises:
   a third light source unit arranged to face the second outer surface to emit the third light beam toward the fifth boundary surface wherein:
   the first light source emits the first light beam toward the first dichroic filter; and
   the second light source emits the second light beam toward the first dichroic filter.

8. The illumination unit as claimed in claim 7, wherein the first and second light source units are arranged such that the first and second light beams incident via the first dichroic filter are totally reflected by the first outer surface and pass through the second dichroic filter toward the third outer surface, and
   the third light source unit is arranged such that the third light beam emitted from the third light source unit is reflected by the third outer surface to proceed toward the second dichroic filter.

9. The illumination unit as claimed in claim 7, wherein a portion of each of the first outer surface and the third outer surface is total reflection-coated to reflect the first and second light beams incident via the first dichroic filter and the third light beam directly emitted from the third light source unit, respectively.

10. The illumination unit as claimed in claim 6, wherein the light beams further comprise a fourth light beam, and the color separation portion further comprises a third dichroic filter arranged between the fourth boundary surface and the fifth boundary surface to reflect the fourth light beam in a fourth wavelength range and to transmit the third light beam in the third wavelength range, and the second dichroic filter transmits the first and second light beams and reflects the third and fourth light beams.

11. The illumination unit as claimed in claim 10, wherein the light source unit comprises:
    a first light source unit arranged to face the first outer surface to emit the first light beam toward the first dichroic filter;
    a second light source unit arranged to face the second outer surface to emit the second light beam toward the first dichroic filter;
    a third light source unit arranged to face the second outer surface to emit the third light beam toward the third dichroic filter; and
    a fourth light source unit arranged to face the third outer surface to emit the fourth light beam toward the third dichroic filter.

12. The illumination unit as claimed in claim 11, wherein the first and second light source units are arranged such that the first and second light beams incident via the first dichroic filter are totally reflected by the first outer surface and pass through the second dichroic filter toward the third outer surface, and
    the third and fourth light source units are arranged such that the third and fourth light beams incident via the second dichroic filter are totally reflected by the third outer surface and proceed toward the second dichroic filter, respectively.

13. The illumination unit as claimed in claim 11, wherein each of the first outer surface and the third outer surface comprises a portion total reflection-coated to reflect the first and second light beams incident via the first dichroic filter and the third and fourth light beams incident via the second dichroic filter, respectively.

14. An illumination unit, comprising:
    a plurality of light source units to emit light beams having a plurality of predetermined wavelengths; and
    a triangular synthesizing prism comprising:
      a plurality of triangular prisms arranged to form a triangle, such that the plurality of light source units are arranged to face at least two different outer surface of the triangular synthesizing prism to transmit the light beams to at least two different inner boundary surface of the plurality of triangular prism with respect to each other, and
      one or more dichroic filters, each disposed between two of the plurality of triangular prisms to reflect or transmit the light beams emitted from the plurality of light sources units according to the wavelengths of the light beams.
    wherein the triangular synthesizing prism synthesizes the light beams emitted from the plurality of light source units without polarizing the light beans.

15. The illumination unit as claimed in claim 14, wherein the triangular synthesizing prism further comprises:
    one or more reflection layers provided, each provided at a portion of an outer surface thereof to totally reflect the light beams emitted from the plurality of light source units.

16. The illumination unit as claimed in claim 14, wherein the light beams emitted from the plurality of light source units comprise:
    a red light beam;
    a green light beam; and
    a blue light beam.

17. The illumination unit as claimed in claim 16, wherein the light beams emitted from the plurality of light source units further comprise:
    at least one of a yellow light beam, a cyan light beam, and a magenta light beam.

18. The illumination unit as claimed in claim 14, wherein the plurality of triangular prisms are arranged to form an equilateral triangle.

19. The illumination unit as claimed in claim 14, wherein the plurality of triangular prisms comprises:
    three congruent isosceles triangles arranged to form an equilateral triangle.

20. An image projection apparatus comprising:
    an illumination unit comprising:
      a plurality of light source units to emit light beams having different wavelengths, and
      a synthesizing prism to synthesize the light beams emitted from the light source units to proceed on the same path with respect to each other, the synthesizing prism comprising:
        a first triangular prism comprising a first outer surface to transmit or reflect a first portion of the light beams according to a direction in which the light beams are input, and first and second boundary surfaces, a second triangular prism comprising a second outer surface to transmit a second portion of the light beams, a third boundary surface arranged to face the second boundary surface, and a fourth boundary surface, a third triangular prism comprising a third outer surface to transmit or reflect the first and second portions of the light beams according to a direction in which the light beams are input, a fifth boundary surface arranged to face the fourth boundary surface, and a sixth boundary surface arranged to face the first boundary surface, and a color separation portion arranged at least one of positions between the second boundary surface and the third boundary surface, the fourth boundary surface and the fifth boundary surface, and the sixth boundary surface and the first boundary surface, to selectively transmit or reflect the light beams according to a wavelength of each light beam;

wherein the plurality of light source units comprises:

a first light source unit arranged to face the first outer surface to emit the first light beam toward the second boundary surface, and a second light source unit arranged to face the second outer surface to emit the second light beam toward the third boundary surface an image forming device to form an image corresponding to the light beams synthesized by the illumination unit;

a projection lens unit to magnify the image formed by the image forming device and to project the magnified image; and a screen to display the projected image.

21. The image projection apparatus as claimed in claim 20, further comprising an optical integrator arranged between the illumination unit and the image forming device to make the light beams emitted from the illumination unit a uniform light beam.

22. The image projection apparatus as claimed in claim 21, wherein the optical integrator comprises a glass rod having a cubic structure to transfer the light beams emitted from the illumination unit to an inner portion thereof by totally reflecting the light beams.

23. The image projection apparatus as claimed in claim 21, wherein the optical integrator comprises a fly-eye lens array including at least one fly-eye lens including each of a plurality of lens cells having a convex or cylindrical shape arranged to neighbor one another.

24. The image projection apparatus as claimed in claim 21, wherein the image forming device comprises a reflection type image forming device to form the image by selectively reflecting the uniform light beam emitted from the optical integrator, and further comprising:

a beam splitter arranged between the illumination unit and the image forming device to change a path of the uniform light beam and the image such that the uniform light beam emitted from the optical integrator proceeds toward the image forming device and the image formed by the image forming device proceeds toward the projection lens unit.

25. The image projection apparatus as claimed in claim 24, wherein the reflection type image forming device comprises a digital micromirror device and the beam splitter comprises an internal total reflection mirror to totally reflect the uniform light beam emitted from the optical integrator toward the digital micromirror device and to transmit the image formed by the digital micromirror device toward the projection lens unit.

26. The image projection apparatus as claimed in claim 24, further comprising:

a polarization changing device arranged between the illumination unit and the beam splitter to make the uniform light beam having a particular polarization proceed toward the beam splitter by changing a direction of polarization of the uniform light beam, wherein the reflection type image forming device comprises a reflection type LCD device, and the beam splitter comprises a polarization beam splitter to transmit or reflect the uniform light beam and the image according to a direction of polarization thereof.

27. The image projection apparatus as claimed in claim 21, further comprising:

a polarization changing device arranged between the illumination unit and the image forming device to make the uniform light beam having a particular polarization proceed toward the image forming device by changing a direction of polarization of the uniform light beam, wherein the image forming device comprises a transmission type LCD device to form the image by selectively transmitting the uniform light beam emitted from the optical integrator.

28. An image projection apparatus, comprising:

an illumination unit comprising:

a plurality of light source units to emit light beams having a plurality of predetermined wavelengths, a triangular synthesizing prism comprising a plurality of triangular prisms arranged to form a triangle, such that the light plurality of light source units are arranged to face at least two different outer surfaces of the triangular synthesizing prism to transmit the light beams to at least two different inner boundary surface of the plurality of triangular prisms with respect to each other, and one or more dichroic filters, each disposed between two of the plurality of triangular prisms to reflect or transmit the light beams emitted from the plurality of light sources units according to the wavelengths of the light beams; and a display device to display an image corresponding to the light beams output from the triangular synthesizing prism, wherein the triangular synthesizing prism synthesizes the light beams emitted from the plurality of light sources units without polarizing the light beams.

29. The image projection apparatus as claimed in claim 28, wherein the display device comprises:

a display unit to form the image corresponding to the light beams output from the triangular synthesizing prism;

a projection lens unit to magnify the image and project the magnified image; and a screen to display the projected image.

30. The image projection apparatus as claimed in claim 29, wherein the display unit comprises one of a digital micromirror device (DMD), a reflection type liquid crystal display (LCD), or a transmission type LCD.

* * * * *